United States Patent
Woo (10) Patent No.: US 11,101,306 B2
(45) Date of Patent: Aug. 24, 2021

(54) IMAGE SENSING DEVICE

(71) Applicant: SK hynix Inc., Icheon-si (KR)

(72) Inventor: Donghyun Woo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 64 days.

(21) Appl. No.: 16/687,304

(22) Filed: Nov. 18, 2019

(65) Prior Publication Data

US 2021/0020674 A1 Jan. 21, 2021

(30) Foreign Application Priority Data

Jul. 19, 2019 (KR) ............ 10-2019-0087322

(51) Int. Cl.
*H01L 27/146* (2006.01)
*H04N 5/351* (2011.01)
*H04N 5/3745* (2011.01)
*H04N 5/378* (2011.01)

(52) U.S. Cl.
CPC .. *H01L 27/14614* (2013.01); *H01L 27/14603* (2013.01); *H01L 27/14607* (2013.01); *H01L 27/14643* (2013.01); *H04N 5/351* (2013.01); *H04N 5/378* (2013.01); *H04N 5/37452* (2013.01)

(58) Field of Classification Search
CPC ......... H01L 27/14614; H01L 27/14603; H01L 27/14607; H01L 27/14643
See application file for complete search history.

(56) References Cited

U.S. PATENT DOCUMENTS

| | | | |
|---|---|---|---|
| 2015/0115291 A1* | 4/2015 | Kim | H01L 27/14605 257/80 |
| 2019/0131326 A1* | 5/2019 | Kim | H01L 27/14689 |
| 2021/0020682 A1* | 1/2021 | Ihara | H01L 27/14641 |

FOREIGN PATENT DOCUMENTS

| | | |
|---|---|---|
| KR | 10-2015-0050029 | 5/2015 |
| KR | 10-2016-0018506 | 2/2016 |

* cited by examiner

*Primary Examiner* — Joseph C. Nicely
(74) *Attorney, Agent, or Firm* — Perkins Coie LLP (57) ABSTRACT

An image sensor includes a substrate and first and second transfer gates. The substrate includes not only a photodiode in which photocharges corresponding to the amount of incident light are accumulated, but also a floating diffusion (FD) region in which the photocharges are received and accumulated. The first and second transfer gates transmit the photocharges from the photodiode to the floating diffusion (FD) region. At least some parts of the first transfer gate are formed to overlap with the second transfer gate.

20 Claims, 8 Drawing Sheets

IMAGE SENSING DEVICE

CROSS-REFERENCE TO RELATED APPLICATION

This patent document claims priority and benefits of Korean patent application No. 10-2019-0087322, filed on Jul. 19, 2019, which is incorporated in its entirety by reference herein.

TECHNICAL FIELD

The technology and implementations disclosed in this patent document generally relate to an image sensing device, and more particularly to an image sensing device for detecting an amount of incident light.

BACKGROUND

An image sensing device is a semiconductor device for capturing light that is incident thereon to produce an image. Recently, with the increasing development of computer industries and communication industries, the demand for high-quality and high-performance image sensing devices in, for example, smartphones, digital cameras, game consoles, Internet of Things (IoT), robots, surveillance cameras, medical micro-cameras, etc., has been rapidly increasing.

Image sensors may be generally classified into CCD (Charge Coupled Device) image sensors and CMOS (Complementary Metal Oxide Semiconductor) image sensors. CCD image sensors have less noise and better image quality than CMOS image sensors. However, CMOS image sensors have a simpler and more convenient driving scheme. In addition, CMOS image sensors may be used to integrate a signal processing circuit in a single chip, making it easy to miniaturize the sensors for implementations in a product, with the added benefit of consuming very lower power. CMOS image sensors can be fabricated using a CMOS fabrication technology which requires lower manufacturing costs as compared to the CCD image sensors. CMOS image sensors have been widely used due to their suitability for implementation in a mobile device.

SUMMARY

The disclosed technology relates to image sensing devices with increased transmission efficiency in transferring photocharges.

In accordance with an embodiment of the disclosed technology, an image sensor includes a substrate and first and second transfer gates. The substrate may include not only a photodiode in which photocharges corresponding to the amount of incident light are accumulated, but also a floating diffusion (FD) region in which the photocharges are received and accumulated. The first and second transfer gates may transmit the photocharges from the photodiode to the floating diffusion (FD) region. At least some parts of the first transfer gate may be formed to overlap with the second transfer gate.

The first transfer gate may be disposed over the substrate, and the second transfer gate may be buried in the substrate.

The bottom surface of the first transfer gate may be higher in height than the top surface of the second transfer gate.

The second transfer gate may be disposed to cover the photodiode.

The image sensor may further include a first gate insulation film disposed between the first transfer gate and the second transfer gate.

The image sensor may further include a second gate insulation film disposed between the second transfer gate and the substrate.

Some other parts of the first transfer gate may be formed to overlap with the floating diffusion (FD) region.

In a photocharge accumulation section, the second transfer gate may be configured to receive a negative(−) voltage.

In a photocharge transmission section, each of the first transfer gate and the second transfer gate may receive a positive(+) voltage.

The voltage applied to the first transfer gate may be higher than the voltage applied to the second transfer gate.

In accordance with another embodiment of the disclosed technology, an image sensor includes a photodiode in which photocharges corresponding to the amount of incident light are accumulated, a floating diffusion (FD) region in which the photocharges are received and accumulated, and first and second transfer transistors coupled in series between the photodiode and the floating diffusion (FD) region so as to transmit the photocharges. At least some parts of a first transfer gate of the first transfer transistor may be formed to overlap with a second transfer gate of the second transfer transistor.

It is to be understood that both the foregoing general description and the following detailed description of the disclosed technology are illustrative and explanatory and are intended to provide further explanation of the disclosure as claimed.

DETAILED DESCRIPTION

Reference will now be made in detail to the embodiments of the disclosed technology, examples of which are illustrated in the accompanying drawings. Wherever possible, the same reference numbers will be used throughout the drawings to refer to the same or like parts.

Figure 1:
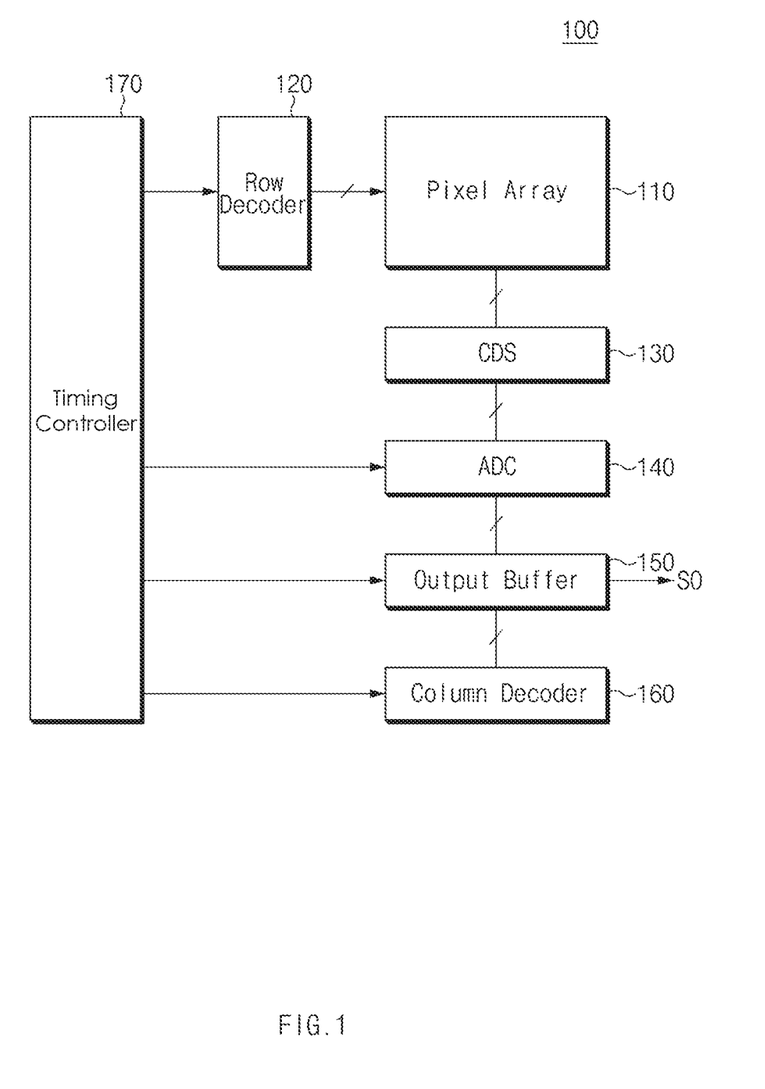
FIG. 1 is an example block diagram illustrating an image sensing device based on some implementations of the disclosed technology.

FIG. 1 is an example block diagram illustrating an image sensing device, e.g., image sensor 100, based on some implementations of the disclosed technology.

Referring to FIG. 1, the image sensor 100 may include a pixel array 110, a row decoder 120, a correlated double sampling (CDS) circuit 130, an analog-to-digital converter (ADC) 140, an output buffer 150, a column decoder 160, and a timing controller 170. While FIG. 1 shows an example of the image sensor 100 for illustration purposes, at least some elements as shown in FIG. 1 can be omitted or any additional element can be added to the image sensor 100.

The pixel array 110 may include a plurality of unit pixels 200 arranged in a two-dimensional (2D) array including rows and columns. In the plurality of unit pixels 200, at least two unit pixels may be designed to have a shared pixel structure where at least two unit pixels share at least one element, e.g., a floating diffusion region, or readout circuit, or others. The plurality of unit pixels 200 include photoelectric conversion elements designed to convert an optical signal or incident light into an electrical signal. The photoelectric conversion elements may include, e.g., a photodiode, a photo transistor, a photo gate, or other photosensitive circuitry capable of converting light into a pixel signal (e.g., a charge, a voltage or a current). The pixel array 110 may receive a drive signal that includes a row selection signal, a pixel reset signal, a transmission (Tx) signal, etc. from the row decoder 120, and may be driven by the drive signal received from the row decoder 120.

The row decoder 120 may drive the pixel array 110 under control of the timing controller 170. In some implementations, the row decoder 120 may select at least one row from the pixel array 110. The row decoder 120 may generate a row selection signal to select at least one of a plurality of rows. The row decoder 120 may sequentially enable a pixel reset signal for pixels corresponding to at least one selected row, and a transmission (Tx) signal for the pixels. As a result, an analog-type reference signal and an image signal that are generated from each pixel of the selected row may be sequentially transmitted to the CDS circuit 130. The reference signal and the image signal will be referred to as a pixel signal.

The CDS circuit 130 may sequentially sample and hold the reference signal and the image signal that are transferred from each of the plurality of column lines in the pixel array 110. Thus, the CDS circuit 130 may sample and hold levels of the reference signal and the image signal that correspond to each column of the pixel array 110.

The CDS circuit 130 may transmit, to the ADC 140, a correlated double sampling (CDS) signal corresponding to the reference signal and the image signal from each column of the pixel array 110 upon receiving a control signal from the timing controller 170.

The ADC 140 may receive the CDS signal corresponding to each column from the CDS circuit 130, may convert the received CDS signal into a digital signal, and may thus output the digital signal. The ADC 140 may perform counting and calculation operations based on the CDS signal for each column and a ramp signal received from the timing controller 170. Thus, the ADC 140 may generate digital image data in which noise (for example, unique reset noise for each pixel) corresponding to each column is removed.

The ADC 140 may include a plurality of column counters corresponding to respective columns of the pixel array 110, and may convert the CDS signal for each column into a digital signal using the column counters, resulting in providing image data. In some implementations, the ADC 140 may include a single global counter, and may convert a CDS signal corresponding to each column into a digital signal using a global code received from the global counter.

The output buffer 150 may receive image data for each column from the ADC 140, may capture the received image data, and may output the captured image data. The output buffer 150 may temporarily store image data that has been output from the ADC 140 upon receiving a control signal from the timing controller 170. The output buffer 150 may operate as an interface configured to compensate for a difference in transmission (Tx) speed (or in processing speed) between the image sensor 100 and another device coupled to the image sensor 100.

The column decoder 160 may select a column of the output buffer 150 upon receiving a control signal from the timing controller 170, and may sequentially output the temporarily stored image data to the output buffer 150. In some implementations, the column decoder 160 may receive an address signal from the timing controller 170, may generate a column selection signal based on the received address signal, and may select a column of the output buffer 150. Thus, the column decoder 160 may control image data to be output as an output signal (SO) from the selected column of the output buffer 150.

The timing controller 170 may control the row decoder 120, the ADC 140, the output buffer 150, and the column decoder 160.

The timing controller 170 may transmit a clock signal needed for the constituent elements of the image sensor 100, a control signal needed for timing control, and address signals needed for selection of a row or column to the row decoder 120, the column decoder 160, the ADC 140, and the output buffer 150. In accordance with the embodiment, the timing controller 170 may include a logic control circuit, a phase locked loop (PLL) circuit, a timing control circuit, a communication interface circuit, etc.

Figure 2:
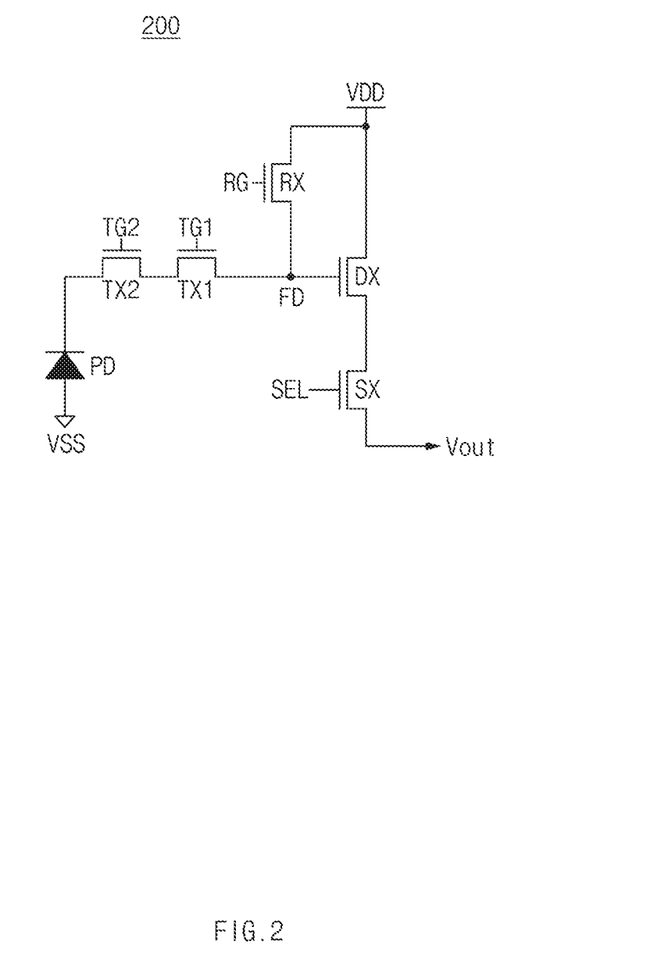
FIG. 2 is an example circuit diagram illustrating each of unit pixels contained in a pixel array shown in FIG. 1 based on some implementations of the disclosed technology.

FIG. 2 is an example circuit diagram illustrating each of unit pixels in the pixel array 110 shown in FIG. 1.

Referring to FIG. 2, an equivalent circuit 200 for each of the unit pixels contained in the pixel array 110; the equivalent circuit may include a photoelectric conversion element, e.g., a photodiode PD, a first transfer transistor TX1, a second transfer transistor TX2, a reset transistor RX, a drive transistor DX, and a selection transistor SX. Although the reset transistor RX, the drive transistor DX, and the selection transistor SX are allocated to the photodiode PD in FIG. 2, other implementations are also possible. For example, at least one transistor can be shared by at least two photodiodes to provide a shared pixel structure.

The photodiode PD may accumulate photocharges corresponding to the amount of incident light. One end of the photodiode PD may be coupled to a source voltage VSS, and the other end of the photodiode PD may be coupled to one or more transfer transistors TX. In some implementations, the source voltage VSS may be a ground voltage. In some other implementations, the source voltage VSS may have voltage level other than the ground voltage. Although FIG. 2 shows the photodiode PD as an example of the photoelectric conversion element, the photodiode PD may be implemented as a phototransistor, a photogate, a pinned photodiode or a combination thereof.

The first transfer transistor TX1 and the second transfer transistor TX2 may be coupled in series between the photodiode PD and the floating diffusion (FD) region. The first transfer transistor TX1 may be turned on or off in response to a first transmission control signal TG1, so that the first transfer transistor TX1 may transmit photocharges accumulated in the photodiode PD to the floating diffusion (FD) region. The second transfer transistor TX2 may be turned on or off in response to a second transmission control signal TG2, so that the second transfer transistor TX2 may transmit photocharges accumulated (or stored) in the photodiode PD to the floating diffusion (FD) region. Detailed operations of the first and second transfer transistors TX1 and TX2 will be described later with reference to FIG. 5.

The floating diffusion (FD) region may receive photocharges from the photodiode PD through the first and second transfer transistors TX1 and TX2 and store the received photocharges in the floating diffusion (FD) region. In some implementations, the floating diffusion (FD) region may be implemented as a single junction capacitor.

The reset transistor TX may be coupled between a drain voltage (VDD) terminal and the floating diffusion (FD) region, and may reset a potential of the floating diffusion (FD) region to the drain voltage VDD in response to a reset control signal RG. In some implementations, the drain voltage VDD may be a power-supply voltage. In some other implementations, the drain voltage VDD may have a different voltage level from the power-supply voltage.

The drive transistor DX may amplify a change in electric potential of the floating diffusion (FD) region that has received the photocharges accumulated in the photodiodes PD, and may transmit the amplified photocharges to the selection transistor SX. In some implementations, the drive transistor DX may operate as a source follower transistor.

The selection transistor SX may select at least one pixel to be read. The read operation can be done in units of a row. The selection transistor SX may be turned on by a selection control signal SEL. The selection transistor SX can output an output voltage (Vout) which corresponds to the electric potential change of the floating diffusion (FD) region provided to a drain (e.g., a source of the source follower transistor) of the selection transistor SX.

The output voltage (Vout) of the selection transistor SX may correspond to a reference signal (e.g., a signal corresponding to the reset floating diffusion (FD) region) depicted in FIG. 1 and an image signal (e.g., a signal corresponding to the floating diffusion (FD) region in which photocharges received from the photodiode PD are accumulated).

Figure 3:
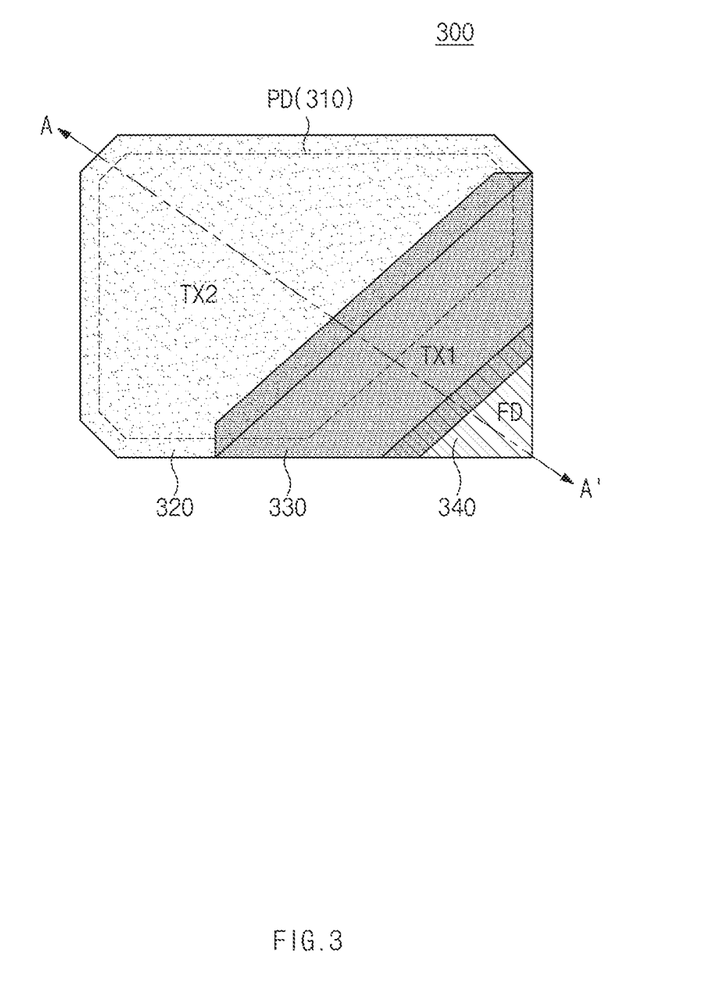
FIG. 3 is an example layout diagram illustrating a unit pixel based on some implementations of the disclosed technology.

FIG. 3 is an example layout diagram illustrating the unit pixel according to an embodiment of the disclosed technology.

FIG. 3 shows only a part of the unit pixel and thus only some elements are shown; additional elements such as the reset transistor RX, the drive transistor DX, and the selection transistor SX can be added to the single unit pixel. The additional elements may be located around the photodiode PD, for example, at an upper peripheral region (not shown), at a lower peripheral region (not shown), at a left peripheral region (not shown), and/or at a right peripheral region (not shown) of each photodiode PD.

In some implementations, the unit pixel shown in FIG. 3 may be configured to have a shared pixel structure where the unit pixel shown in FIG. 3 shares at least some elements (e.g., a floating diffusion (FD) region, a reset transistor RX, a drive transistor DX, a selection transistor SX, or others) with one or more adjacent unit pixels. For example, the shared pixel structure can include the four unit pixels which are arranged in a (2×2) matrix, a (1×4) matrix, or a (4×1) matrix.

The photodiode (PD) 310 may be arranged within an active region of the unit pixel (see the dotted boundary of the photodiode in FIG. 3). The photodiode (PD) can occupy the area within the active region as much as possible to increase light reception (Rx) efficiency.

A second transfer gate 320 (see the lightly speckled portion in FIG. 3) of the second transfer transistor TX2 may be arranged to partially overlap with the photodiode 310. As depicted in FIG. 3, the second transfer gate 320 may be arranged to cover a greater portion of the photodiode 310. The remaining portion of the photodiode 310 not covered by the second transfer gate 320 may be covered by the first transfer gate 330. In some implementations, the second transfer gate 320 may be arranged to cover the entirety of the photodiode 310.

The first transfer gate 330 (see the grey shaded portion in FIG. 3) may be arranged between the second transfer gate 320 and the floating diffusion region FD such that end parts of the first transfer gate 330 overlap with the photodiode (PD) 310 and the floating diffusion (FD) region 340. One end of the first transfer gate 330 of the first transfer transistor TX1 may be arranged to overlap with at least a portion of the second transfer gate 320, and the other end of the first transfer gate 330 of the first transfer transistor TX1 may be arranged to overlap with a portion of the floating diffusion (FD) region 340. One end of the first transfer gate 330 formed to overlap with the portion of the second transfer gate 320 may extend along one side of the second transfer gate 320, and the other end of the first transfer gate 330 formed to overlap with the portion of the floating diffusion (FD) region 340 may extend along one side of the floating diffusion (FD) region 340.

The floating diffusion (FD) region 340 may be disposed at one side of the active region of the unit pixel. Although the floating diffusion (FD) region 340 may be formed in a triangular shape in FIG. 3, other implementations are also possible. For example, when four unit pixels are configured to provide a shared pixel, the floating diffusion (FD) region 340 may be formed in a polygonal shape such as a diamond shape.

Figure 4:
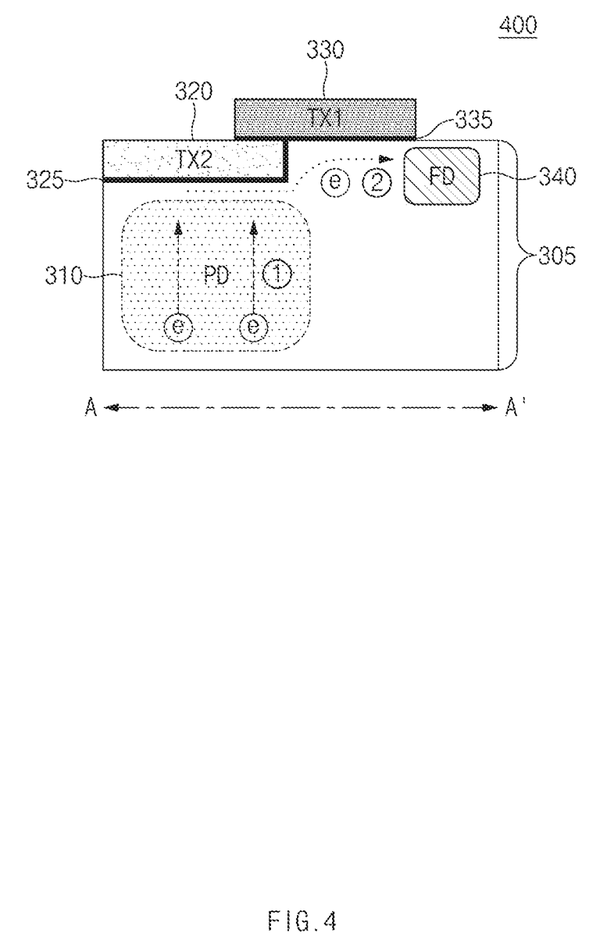
FIG. 4 is an example cross-sectional view illustrating a unit pixel shown in FIG. 3 based on some implementations of the disclosed technology.

FIG. 4 is an example cross-sectional view of the unit pixel shown in FIG. 3, which is taken along the line A-A' of FIG. 3.

Referring to FIG. 4, a substrate 305 may be or include a silicon (Si) substrate including a P-type epitaxial layer. In FIG. 4, a top surface and a bottom surface of the substrate 305 may correspond to a front side indicating a front surface and a back side indicating a back surface, respectively. The unit pixel shown in FIG. 4 may be formed to have a Back Side Illumination (BSI) structure that receives incident light through the back side of the substrate 305. In some implementations, the substrate 305 may further include a P-type high-density impurity layer (not shown) which may be located adjacent to the back side of the substrate 305. Impurity density of the P-type high-density impurity layer (not shown) may be higher than impurity density of a P-type epitaxial layer of the substrate 305. The electrical potential in the back side of the substrate 305 can decrease by various reasons including a defect of a dangling bond in silicon, surface defect caused by an etching stress, or an interface trap, which result in the undesired formation of a depletion well. The P-type high-density impurity layer (not shown) can prevent the reduction of the electrical potential in the back side of the substrate 305 and thus can also prevent the formation of the depletion well.

The photodiode 310 may be formed as an N-type impurity region doped with N-type ions within the substrate 305. As previously described above, electrons generated by light incident onto the photodiode 310 may be accumulated in the photodiode 310.

As each unit pixel is gradually reduced in size due to various factors such as the increasing number of smaller-sized chips and higher-resolution pixel arrays, there is a need for each unit pixel to guarantee a Full Well Capacity (FWC) of a preset level or greater so as to implement higher-performance image sensors. Accordingly, the photodiode 310 formed to guarantee such FWC needs to be formed more deeply, e.g., further from the front side of the substrate 305. However, as the depth of the photodiode 310 gradually increases, since the distance with regard to the floating diffusion (FD) region 340 increases, it becomes more difficult for the electrons in a region located close to the back side of the substrate 305 to flow into the floating diffusion (FD) region 340. To address this issue, the second transfer gate 320 is arranged in the unit pixel.

In some implementations, the second transfer gate 320 may be formed of or include polysilicon or doped polysilicon capable of receiving a second transfer control signal TG2. In some implementations, the second transfer gate may include other materials than the polysilicon.

The second transfer gate 320 may be included (or buried) in the substrate 305. The second transfer gate 320 may have a depth such that the second transfer gate is located adjacent to or in contact with the photodiode 310. The second transfer gate 320 may be formed to overlap with the photodiode 310 and may be disposed in the substrate 305. In some implementations, the bottom surface of the second transfer gate 320 may be located lower than the bottom surface of the first transfer gate 330. Since the second transfer gate 320 is disposed closer to the photodiode region 310 as compared to the first transfer gate 330, the electrons in the photodiode region 310 including a region located close to the back side of the substrate 305 can more easily flow into the floating diffusion (FD) region 340. In some implementations, with the existence of the first gate insulation film 335 which will be discussed later, the top surface of the second transfer gate 320 may be lower in height than the bottom surface of the first transfer gate 330. In some implementations, the second transfer gate 320 and the first transfer gate 330 may include portions that overlap each other in a vertical direction.

A second gate insulation layer 325 may be disposed between the second transfer gate 320 and the P-type epitaxial layer of the substrate 305. Thus, the second transfer gate 320 can be electrically isolated from the P-type epitaxial layer. In some implementations, the second gate insulation film 325 may be formed of or include an oxide material, but other insulating materials can be used for the second gate insulating film 325.

In some implementations, the first transfer gate 330 may be formed of or include polysilicon or doped polysilicon capable of receiving the first transmission control signal TG1. In some implementations, the first transfer gate 330 may include other materials than the polysilicon.

The first transfer gate 330 may be formed over the substrate 305. As illustrated in FIG. 3, one side of the first transfer gate 330 may partially overlap with the second transfer gate 320, and the other side of the first transfer gate 330 may partially overlap with the floating diffusion (FD) region 340. Differently from FIG. 4, when the first transfer gate and the second transfer gate are disposed at the same height (e.g., over the substrate 305), an insulation structure having a predetermined thickness needs to be disposed between the first transfer gate and the second transfer gate. In this case, a dead zone for interfering with the movement of electrons in a horizontal direction may be formed below the insulation structure. By arranging the first transfer gate 330 and the second transfer gate 320 at different heights to overlap each other as shown in FIG. 4, it is possible to avoid or prevent the dead zone, which results in the increase of the transmission efficiency in the pixel array.

A first gate insulation film 335 may be disposed not only between the first transfer gate 330 and the substrate 305, but also between the first transfer gate 330 and the second transfer gate 320, so that the first transfer gate 330 can be electrically isolated from the second transfer gate 320. In some implementations, the first gate insulation film 335 may be formed of or include an oxide material. In some other implementations, the first gate insulating film 335 can include other insulating materials than oxide materials.

The floating diffusion (FD) region 340 may be formed of or include an N-type impurity region doped with N-type ions within the substrate 305. As previously described above, electrons flowing from the photodiode PD through the first and second transfer transistors TX1 and TX2 may be stored in the floating diffusion (FD) region 340.

Figure 5:
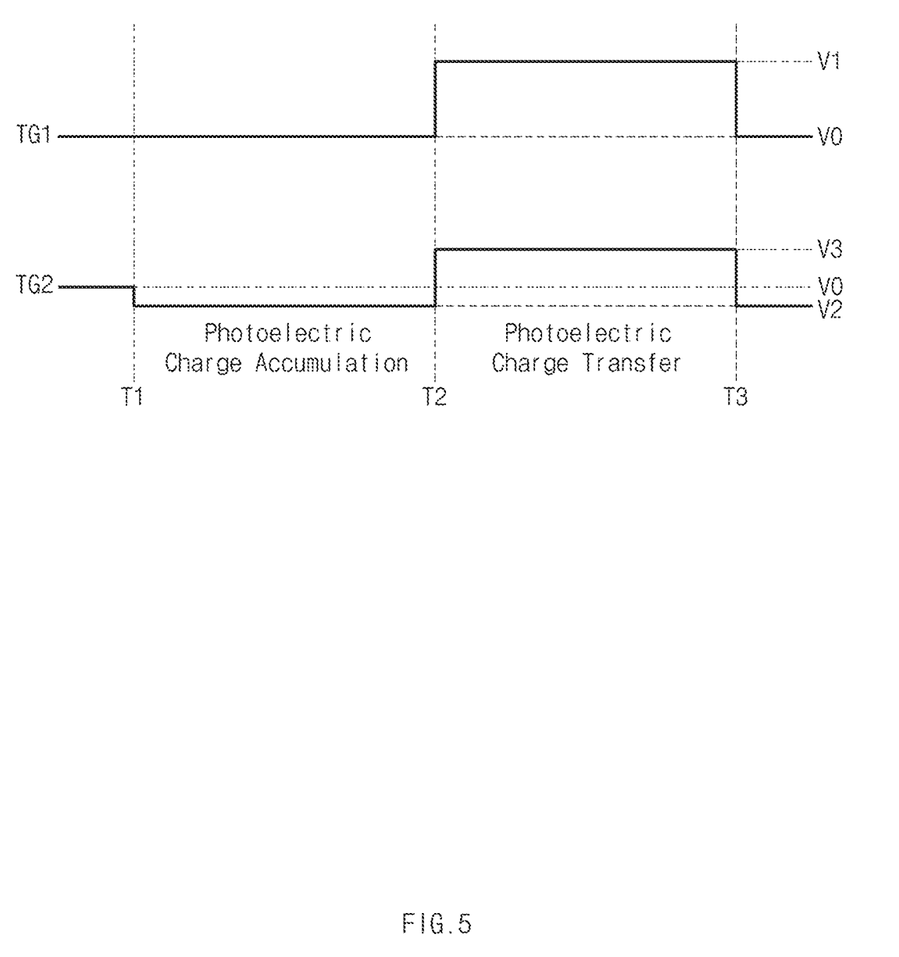
FIG. 5 is an example timing diagram illustrating operations of first and second transfer transistors based on some implementations of the disclosed technology.

FIG. 5 is an example timing diagram illustrating operations of first and second transfer transistors according to an embodiment of the disclosed technology.

Referring to FIGS. 4 and 5, the first transmission control signal (TG1) may be applied to the first transfer gate 330, and the second transmission control signal (TG2) may be applied to the second transfer gate 320. FIG. 5 shows a first time interval proceeding from a first time point T1 to a second time point T2, and a second time interval proceeding from the second time point T2 to a third time point T3. The first time interval may correspond to a photocharge accumulation time period during which electrons are generated in response to incident light and accumulated in the photodiode 310. The second time interval may correspond to a photocharge transmission section during which electrons accumulated in the photodiode 310 flow into the floating diffusion (FD) region 340. Although FIG. 5 shows two time intervals only, additional intervals can be further included between the first interval and the second interval. For example, although FIG. 5 illustrates that the second interval starts right after the first interval, a predetermined time interval can be present between the first and second intervals, causing the first and the second intervals to be separated from each other by a predetermined amount of time. In some implementations, each of the first and second transmission control signals TG1 and TG2 may have the same waveform as those of transmission control signals that are used in a conventional pixel in which only one transfer gate is included in the unit pixel.

The first transmission control signal TG1 may have a voltage having a first low level, V0, or a first high level, V1. The second transmission control signal TG2 may have a voltage having the first low level, V0, a second low level, V2, or a second high level, V3. The first transfer transistor TX1 may be turned off in response to receiving the first transmission control signal TG1 having the first low level, V0, and the second transfer transistor TX2 may be turned off when receiving the second transmission control signal TG2 having the second low level, V2. The first transfer transistor TX1 may be turned on in response to receiving the first transmission control signal TG1 having the second high level, V1, and the second transfer transistor TX2 may be turned on in response to receiving the second transmission control signal TG2 having the second high level, V3. The first low level, V0, may be a voltage level higher than the second low level, V2, and the first high level, V1, may be a voltage level higher than the second high level, V3. For example, the first low level, V0, may correspond to zero volt (0V), the second low level, V2, may correspond to a negative (−) voltage, and each of the first and second high levels, V1 and V3, may correspond to a positive (+) voltage.

In the first section, the first transfer transistor TX1 may receive the first transmission control signal TG1 having the first low level, V0, and the second transfer transistor TX2 may receive the second transmission control signal TG2 having the second low level, V2, such that each of the first and second transfer transistors TX1 and TX2 can be turned off. In the first section, electrons corresponding to the amount of incident light can be generated and accumulated. In this case, flow of defective electrons (i.e., dark current) generated from the surface of the substrate 305 may operate as noise.

As the second low level, V2, corresponding to a negative (−) voltage is applied to the second transfer gate 320, electrons in the second transfer gate 320 may move to a position closer to the second gate insulation film 325. As a result, holes in the substrate 305 may remain around an interface between the photodiode 310 and the second transfer gate 320. Since holes in the substrate 305 are accumulated around the interface between the photodiode 310 and the second transfer gate 320, the flow of defective electrons (i.e., a dark current) generated at the surface of the substrate 305 during the etching process may be restricted and hindered and thus the dark current can be reduced, which results in improvement of dark current characteristics. In FIG. 4, the second transfer gate 320 may be buried in the substrate 305 while covering the photodiode 310. Depending on the ratio of the photodiode 310 covered by the second transfer gate 320, the level of the dark current restriction can be determined. In some implementations, the second transfer gate 320 can be arranged to cover the entire photodiodes 310 so that the effect of dark current restriction can be maximized.

In the second section, the first transfer transistor TX1 may receive the first transmission control signal TG1 having the first high level, V1, and the second transfer transistor TX2 may receive the second transmission control signal TG2 having the second low level, V3, such that each of the first and second transfer transistors TX1 and TX2 can be turned on. In the second section, electrons accumulated in the photodiode 310 may flow into the floating diffusion (FD) region 340. In this case, since the first high level, V1, is higher than the second high level, V2, a slope of electric potential flowing from the second transfer rate 320 to the first transfer gate 330 may be formed, so that electrons accumulated in the photodiode 310 can more easily flow into the floating diffusion (FD) region 340.

As shown in the specific implementation of FIG. 4, the second transfer gate 320 may cover a greater portion of a top surface of the photodiode 310, and may be buried in the substrate 305. As a result, a vertical electric field may be formed by the second transfer gate 320 receiving the positive (+) voltage, so that electrons in a region located close to the back side of the substrate 305 can easily flow into another region located close to the front side of the substrate 305 (see the electron flow ① in FIG. 4).

As illustrated in FIG. 4, the first transfer gate 330 and the second transfer gate 320 may be formed to overlap each other. Since the first and second transfer gates 330 and 320 receive different voltages, a channel with the electric potential slope is formed in the substrate 305 located around or close to the first transfer gate 330 and the second transfer gate 320 without formation of a dead zone in the substrate 305. As a result, electrons accumulated in the photodiode 310 can easily flow into the floating diffusion (FD) region 340 (see the electron flow ② in FIG. 4).

The disclosed technology provides various implementations of the image sensor 100 which includes two transfer transistors to improve the transmission efficiency of transferring the photocharges accumulated in the photoelectric conversion element. In various implementations of the disclosed technology, the shape and position of two transfer transistors are optimized to improve the transmission efficiency of photocharges. In some implementations, different voltages are applied to the two transfer transistors to maximize the transmission efficiency of photocharges.

In some implementations, one or more transfer gates are disposed over the photodiode and the negative (−) bias voltage is applied to at least one of the transfer gates. By doing so, the flow of the defective electrons can be restricted and hindered, and thus the dark current can be reduced.

Figure 6:
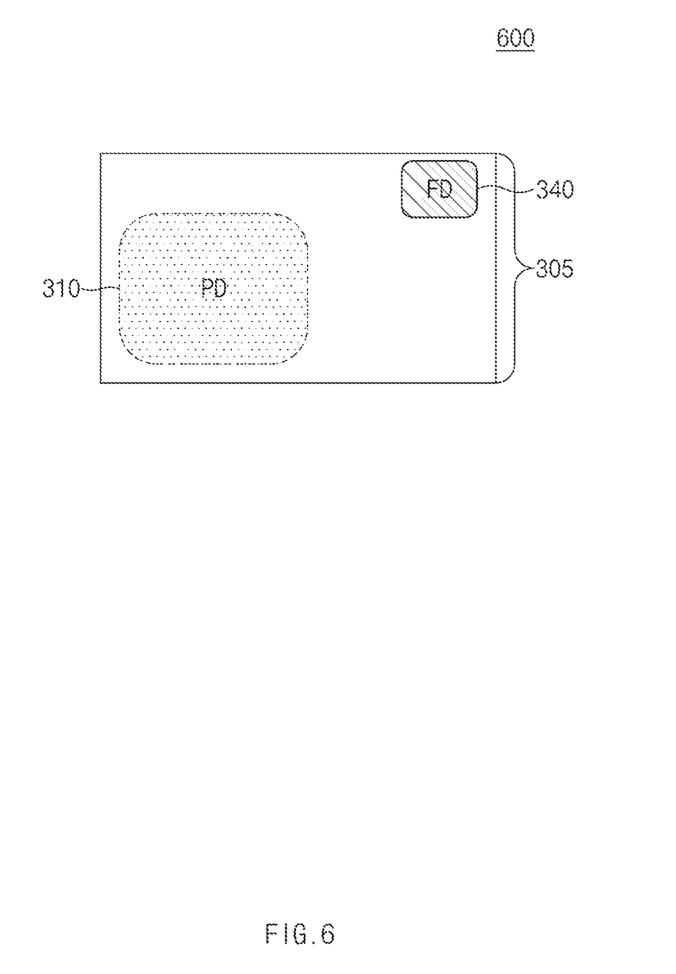
FIGS. 6 to 8 are cross-sectional views illustrating a process for forming a unit pixel based on some implementations of the disclosed technology.
Figure 7:
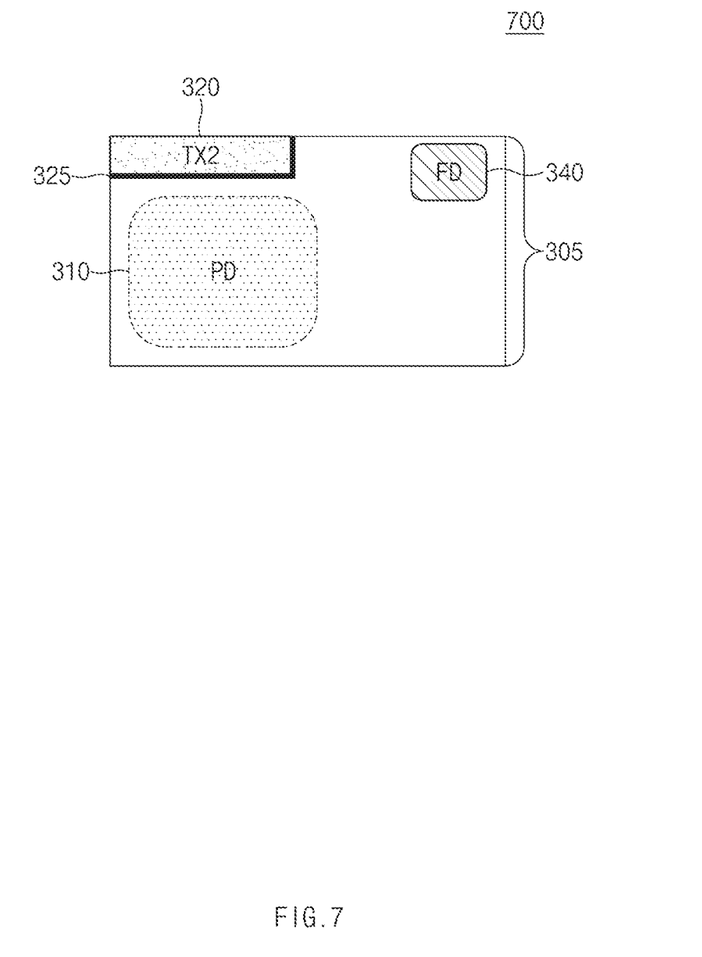
Figure 8:
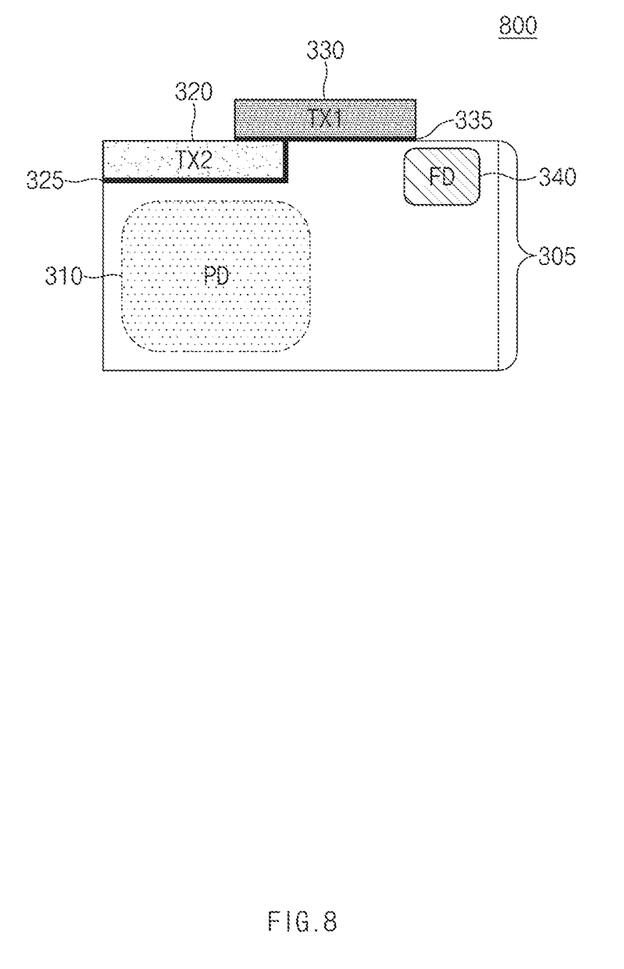

FIGS. 6 to 8 are cross-sectional views illustrating processes for forming a unit pixel according to an embodiment of the disclosed technology.

FIG. 6 shows a first process 600 in which a patterned mask (not shown) is disposed over the substrate 305, so that each of the photodiode 310 and the floating diffusion (FD) region 340 can be formed by an ion implantation process. In some implementations, N-type ions are implemented to form the photodiode 310 and the floating diffusion (FD) region 340. In this case, N-type ions for forming the photodiode 310 may be different in doping density and implantation energy from N-type ions for forming the floating diffusion (FD) region 340. In some implementations, the photodiode 310 and the floating diffusion (FD) region can be formed at the same time. In some other implementations, the floating diffusion (FD) region 340 may be formed after the photodiode 310 is formed, e.g., after the formation of the first transfer gate 330.

FIG. 7 shows a second process in which the second transfer gate 320 is formed. After the photodiode 310 and the floating diffusion (FD) region 340 are formed in the first process 600, a patterned mask (not shown) is removed, and a patterned hard mask (not shown) may be formed over the substrate 305. An etching is performed using the patterned hard mask (not shown) as an etch barrier, and thus the substrate 305 is etched and a trench can be formed. The trench may be formed over the photodiode 310 to cover a greater portion of the photodiode 310. The trench may be formed to have a predetermined depth in a manner that the distance between the bottom surface of the trench and the top surface of the photodiode 310 is set to a specific distance.

The patterned hard mask (not shown) is removed after the formation of the trench, and a film formed of or including an insulation material may be formed in the trench, resulting in formation of the second gate insulation film 325. In addition, the residual trench may be filled with a conductive material, resulting in the formation of the second transfer gate 320.

FIG. 8 shows a third process 800 in which the first transfer gate 330 is formed. After the planarization of the top surface of the substrate 305, the first gate insulation film 335 and the first transfer gate 330 can be sequentially formed through a deposition process.

It is understood that various embodiments and terminology used herein are not intended to limit technical ideas described in this document to specific embodiments, but rather to include various modifications, equivalents, and/or alternatives of the embodiments. Wherever possible, the same reference numbers will be used throughout the drawings to refer to the same or like portions.

The embodiments of the disclosed technology may provide a variety of effects capable of being directly or indirectly recognized through the above-mentioned patent document.

Although a number of illustrative embodiments consistent with the disclosed technology have been described, it should be understood that numerous other modifications and embodiments can be devised by those skilled in the art.

What is claimed is:
1. An image sensing device, comprising:
a substrate including an active region;

a photoelectric conversion region disposed in the active region and configured to generate photocharges in response to incident light;

a floating diffusion (FD) region disposed outside of the active region and in the substrate, the floating diffusion (FD) region configured to store the photocharges generated in the photoelectric conversion region; and first and second transfer gates having portions disposed to overlap each other and configured to transmit the photocharges from the photoelectric conversion region to the floating diffusion (FD) region.

2. The image sensing device according to claim 1, wherein:

the first transfer gate is disposed over the substrate, and the second transfer gate is disposed in the substrate.

3. The image sensing device according to claim 1, wherein a bottom surface of the first transfer gate is located over a top surface of the second transfer gate.

4. The image sensing device according to claim 1, wherein the second transfer gate is disposed over the photoelectric conversion region.

5. The image sensing device according to claim 1, further comprising:

a first gate insulation film disposed between the first transfer gate and the second transfer gate.

6. The image sensing device according to claim 1, further comprising:

a second gate insulation film disposed on a bottom surface of the second transfer gate.

7. The image sensing device according to claim 1, wherein the first transfer gate includes another portion that overlaps with the floating diffusion (FD) region.

8. The image sensing device according to claim 1, wherein the second transfer gate is configured to receive a control signal with a voltage level that is less than zero.

9. The image sensing device according to claim 1, wherein the first transfer gate and the second transfer gate are respectively configured to receive first and second control signals with voltage levels that are greater than zero.

10. The image sensing device according to claim 9, wherein the voltage level of the first control signal is higher than the voltage level of the second control signal.

11. An image sensing device, comprising:

a photoelectric conversion region configured to generate photocharges in response to receiving an incident light;

a floating diffusion (FD) region disposed apart from the photoelectric conversion region and configured to store the photocharges generated in the photoelectric conversion region; and first and second transfer transistors electrically connected in series between the photoelectric conversion region and the floating diffusion (FD) region and configured to transmit the photocharges from the photoelectric conversion region to the floating diffusion (FD) region, wherein a distance between the second transfer transistor and the photoelectric conversion element is shorter than a distance between the first transfer transistor and the photoelectric conversion region.

12. The image sensing device according to claim 11, further comprising:

a substrate in which the photoelectric conversion region and the floating diffusion (FD) region are disposed, wherein the first transfer gate is disposed over the substrate, and the second transfer gate is disposed in the substrate.

13. The image sensing device according to claim 11, wherein a bottom surface of the first transfer gate is located over a top surface of the second transfer gate.

14. The image sensing device according to claim 11, wherein the second transfer gate is disposed over the photoelectric conversion region.

15. The image sensing device according to claim 11, further comprising:

a first gate insulation film disposed between the first transfer gate and the second transfer gate.

16. The image sensing device according to claim 11, further comprising:

a second gate insulation film disposed on the second transfer gate.

17. The image sensing device according to claim 11, wherein the first transfer gate includes a portion overlapping with the photoelectric conversion region and another portion overlapping with the floating diffusion (FD) region.

18. The image sensing device according to claim 11, wherein:

the second transfer gate is configured to receive a negative voltage.

19. The image sensing device according to claim 11, wherein:

the first transfer gate and the second transfer gate are configured to receive positive voltages with different voltage levels.

20. The image sensing device according to claim 19, wherein the voltage level received by the first transfer gate is higher than the voltage level received by the second transfer gate.

* * * * *